United States Patent
Sodagar

(10) Patent No.: US 12,411,553 B2
(45) Date of Patent: Sep. 9, 2025

(54) METHODS FOR SIGNALING RANDOM ACCESS IN HAPTICS INTERCHANGE FILE FORMAT

(71) Applicant: TENCENT AMERICA LLC, Palo Alto, CA (US)

(72) Inventor: Iraj Sodagar, Los Angeles, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 134 days.

(21) Appl. No.: 18/497,530

(22) Filed: Oct. 30, 2023

(65) Prior Publication Data

US 2024/0201784 A1 Jun. 20, 2024

Related U.S. Application Data

(60) Provisional application No. 63/434,056, filed on Dec. 20, 2022.

(51) Int. Cl.
  *H04B 3/36* (2006.01)
  *G06F 3/01* (2006.01)
  *H03M 7/30* (2006.01)

(52) U.S. Cl.
  CPC .......... *G06F 3/016* (2013.01); *H03M 7/6005* (2013.01)

(58) Field of Classification Search
  CPC ........ G06F 3/016; G06F 3/01; H03M 7/6005; H03M 7/30
  See application file for complete search history.

(56) References Cited

U.S. PATENT DOCUMENTS

| | | | |
|---|---|---|---|
| 9,019,087 B2* | 4/2015 | Bakircioglu | ..... H04N 21/43074 340/407.1 |
| 10,726,686 B2 | 7/2020 | Grancharov et al. | |
| 11,698,680 B2* | 7/2023 | Birnbaum | ........... G06F 3/04815 345/156 |
| 2013/0311881 A1 | 11/2013 | Birnbaum et al. | |
| 2015/0199015 A1 | 7/2015 | Ullrich et al. | |
| 2024/0402813 A1* | 12/2024 | Vezzoli | ................... G06F 3/016 |

FOREIGN PATENT DOCUMENTS

| | | |
|---|---|---|
| WO | 2022/100985 A1 | 5/2022 |
| WO | 2023/052305 A1 | 4/2023 |

OTHER PUBLICATIONS

International Search Report dated Feb. 21, 2024, issued in International Application No. PCT/US 23/36356.
Written Opinion dated Feb. 21, 2024, issued in International Application No. PCT/US 23/36356.
Text for Committee Draft of ISO/IEC 23090-31: Haptics Coding, ISO/IEC JTC 1/SC 29/WG 7 N449, Oct. 27, 2022, 118 pages.

* cited by examiner

*Primary Examiner* — Toan N Pham
(74) *Attorney, Agent, or Firm* — Sughrue Mion, PLLC

(57) ABSTRACT

Method, apparatus, and system for haptic signal processing are provided. The process may include receiving haptic data in an interchange (HJIF) format based on JavaScript Object Notation (JSON) and receiving a moving picture experts group haptics (MPEG_haptics) object associated with a global haptic experience, the MPEG haptics object in the HJIF format comprising a plurality of reset point timestamps. The process may include rendering effects based on the haptic data in the HJIF format; and may include resetting an output of a renderer based on determining that a current timestamp associated with the global haptic experience is equal to a reset point timestamp in the MPEG haptics object.

20 Claims, 6 Drawing Sheets

METHODS FOR SIGNALING RANDOM ACCESS IN HAPTICS INTERCHANGE FILE FORMAT

CROSS-REFERENCE TO RELATED APPLICATION

This application claims priority from U.S. Provisional Application No. 63/434,056, filed on Dec. 20, 2022, the disclosure of which is incorporated herein by reference in its entirety.

FIELD

This disclosure is directed to a set of advanced video coding technologies. More specifically, the present disclosure is directed to encoding and decoding haptic experience for multimedia presentation.

BACKGROUND

Haptics experience has become a part of multimedia presentation. In applications where multimedia presentation includes an aspect of haptic experience, haptic signals may be delivered to the device or wearable and the user may feel the haptic sensations during the use of the application in coordination with the visual and/or audio media experience.

Recognizing the growing popularity of haptic experience in multimedia presentations, motion picture experts group (MPEG) has started working on a compression standard (both for MPEG-DASH and MPEG-I) for haptics as well as carriage of the compressed haptics signaling in ISO based media file format (ISOBMFF).

Related art includes one JSON format and two binary formats. The MPEG immersive haptic stream (MIHS) binary format includes sync signaling, which provides a means for specifying the random access points. However, the HJIF file format defined in the haptic committee draft does not include the signaling of random access points.

SUMMARY

According to embodiments, a method for decoding haptic data may be provided. The method may include receiving haptic data in an interchange (HJIF) format based on JavaScript Object Notation (JSON); receiving a moving picture experts group haptics (MPEG_haptics) object associated with a global haptic experience, the MPEG haptics object in the HJIF format comprising a plurality of sync or reset point timestamps; rendering effects based on the haptic data in the HJIF format; and resetting an output of a renderer based on determining that a current timestamp associated with the global haptic experience is equal to a reset point timestamp in the MPEG haptics object.

According to embodiments, an apparatus for decoding haptic data may be provided. The apparatus may include at least one memory configured to store program code; and at least one processor configured to read the program code and operate as instructed by the program code. The program code may include first receiving code configured to cause the at least one processor to receive haptic data in an interchange (HJIF) format based on JavaScript Object Notation (JSON) object; second receiving code configured to cause the at least one processor to receive a moving picture experts group haptics (MPEG_haptics) object associated with a global haptic experience, the MPEG haptics object in the HJIF format comprising a plurality of sync or reset point timestamps; rendering code configured to cause the at least one processor to render effects based on the haptic data in the HJIF format; and resetting code configured to cause the at least one processor to reset an output of a renderer based on determining that a current timestamp associated with the global haptic experience is equal to a reset point timestamp in the MPEG haptics object.

According to embodiments, a non-transitory computer-readable medium stores computer instructions may be provided. The instructions may include one or more instructions that, when executed by one or more processors of a device for decoding haptic data, cause the one or more processors to receive haptic data in an interchange (HJIF) format based on JavaScript Object Notation (JSON) object; receive a moving picture experts group haptics (MPEG_haptics) object associated with a global haptic experience, the MPEG haptics object in the HJIF format comprising a plurality of sync or reset point timestamps; render effects based on the haptic data in the HJIF format; and reset an output of a renderer based on determining that a current timestamp associated with the global haptic experience is equal to a reset point timestamp in the MPEG haptics object.

BRIEF DESCRIPTION OF THE DRAWINGS

Further features, the nature, and various advantages of the disclosed subject matter will be more apparent from the following detailed description and the accompanying drawings in which.

DETAILED DESCRIPTION

According to an aspect of the present disclosure, methods, systems, and non-transitory storage mediums for parallel processing of dynamic mesh compression are provided. Embodiments of the present disclosure may also be applied to static meshes.

Figure 1:
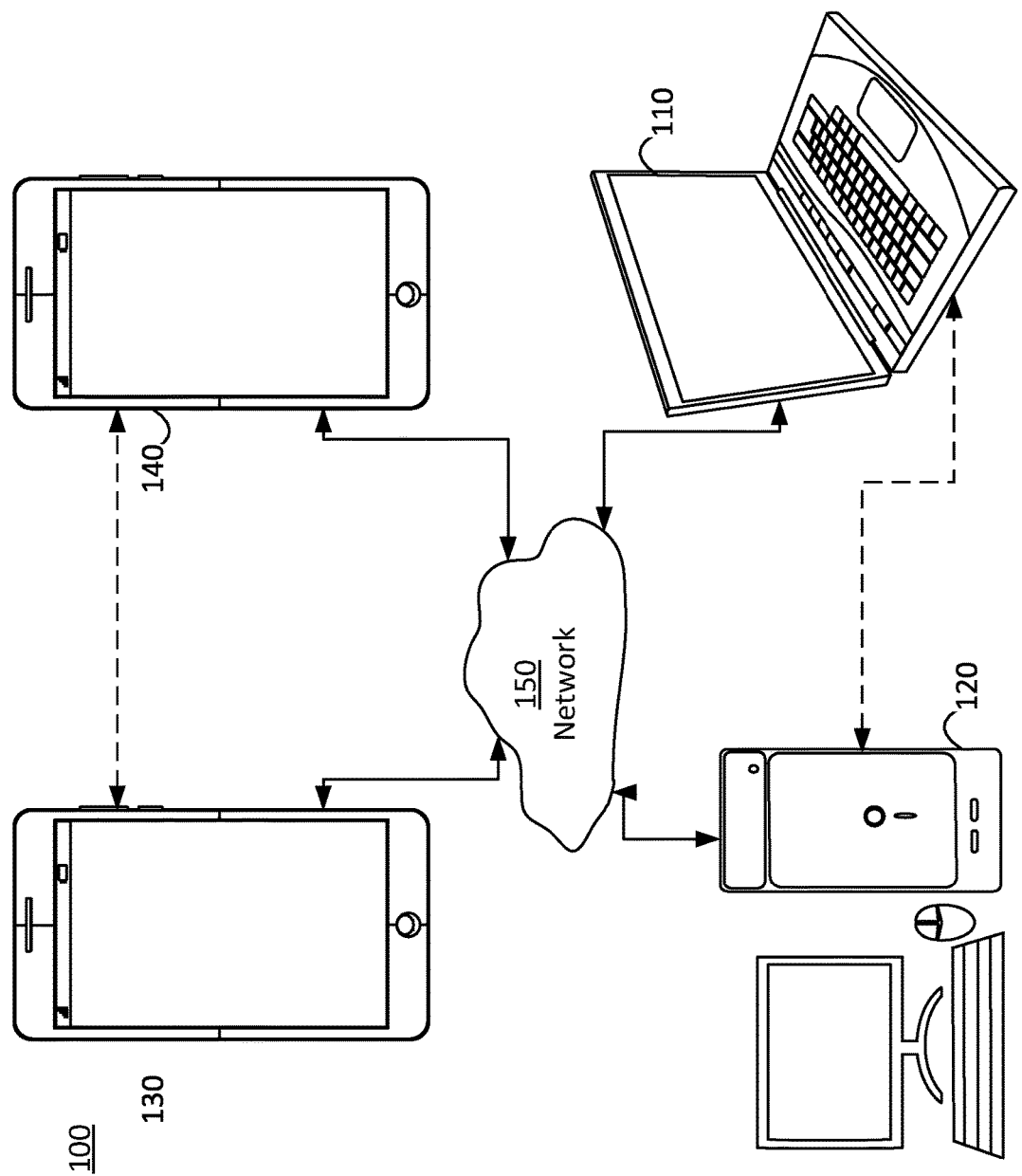
FIG. 1 is a schematic illustration of a simplified block diagram of a communication system, in accordance with embodiments of the present disclosure.
Figure 2:
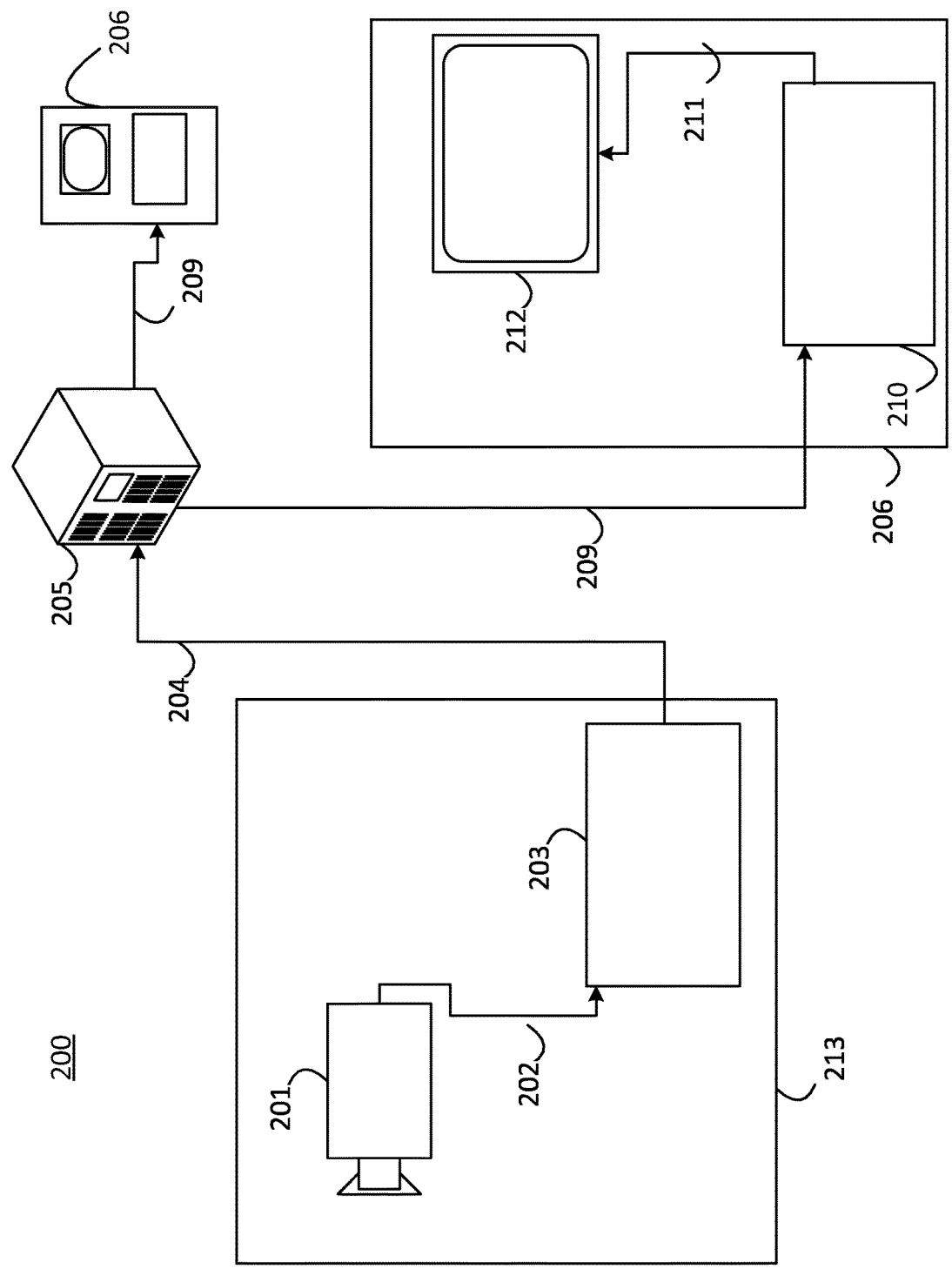
FIG. 2 is a schematic illustration of a simplified block diagram of a streaming system, in accordance with embodiments of the present disclosure.

With reference to FIGS. 1-2, an embodiment of the present disclosure for implementing encoding and decoding structures of the present disclosure are described.

FIG. 1 illustrates a simplified block diagram of a communication system 100 according to an embodiment of the present disclosure. The system 100 may include at least two terminals 110, 120 interconnected via a network 150. For unidirectional transmission of data, a first terminal 110 may code video data, which may include mesh data, at a local location for transmission to the other terminal 120 via the network 150. The second terminal 120 may receive the coded video data of the other terminal from the network 150, decode the coded data and display the recovered video data.

Unidirectional data transmission may be common in media serving applications and the like.

FIG. 1 illustrates a second pair of terminals 130, 140 provided to support bidirectional transmission of coded video that may occur, for example, during videoconferencing. For bidirectional transmission of data, each terminal 130, 140 may code video data captured at a local location for transmission to the other terminal via the network 150. Each terminal 130, 140 also may receive the coded video data transmitted by the other terminal, may decode the coded data and may display the recovered video data at a local display device.

In FIG. 1, the terminals 110-140 may be, for example, servers, personal computers, and smart phones, and/or any other type of terminals. For example, the terminals (110-140) may be laptop computers, tablet computers, media players and/or dedicated video conferencing equipment. The network 150 represents any number of networks that convey coded video data among the terminals 110-140 including, for example, wireline and/or wireless communication networks. The communication network 150 may exchange data in circuit-switched and/or packet-switched channels. Representative networks include telecommunications networks, local area networks, wide area networks, and/or the Internet. For the purposes of the present discussion, the architecture and topology of the network 150 may be immaterial to the operation of the present disclosure unless explained herein below.

FIG. 2 illustrates, as an example of an application for the disclosed subject matter, a placement of a video encoder and decoder in a streaming environment. The disclosed subject matter can be used with other video enabled applications, including, for example, video conferencing, digital TV, storing of compressed video on digital media including CD, DVD, memory stick and the like, and so on.

As illustrated in FIG. 2, a streaming system 200 may include a capture subsystem 213 that includes a video source 201 and an encoder 203. The streaming system 200 may further include at least one streaming server 205 and/or at least one streaming client 206.

The video source 201 can create, for example, a stream 202 that includes a 3D mesh and metadata associated with the 3D mesh. The video source 201 may include, for example, 3D sensors (e.g. depth sensors) or 3D imaging technology (e.g. digital camera(s)), and a computing device that is configured to generate the 3D mesh using the data received from the 3D sensors or the 3D imaging technology. The sample stream 202, which may have a high data volume when compared to encoded video bitstreams, can be processed by the encoder 203 coupled to the video source 201. The encoder 203 can include hardware, software, or a combination thereof to enable or implement aspects of the disclosed subject matter as described in more detail below. The encoder 203 may also generate an encoded video bitstream 204. The encoded video bitstream 204, which may have e a lower data volume when compared to the uncompressed stream 202, can be stored on a streaming server 205 for future use. One or more streaming clients 206 can access the streaming server 205 to retrieve video bit streams 209 that may be copies of the encoded video bitstream 204.

The streaming clients 206 can include a video decoder 210 and a display 212. The video decoder 210 can, for example, decode video bitstream 209, which is an incoming copy of the encoded video bitstream 204, and create an outgoing video sample stream 211 that can be rendered on the display 212 or another rendering device (not depicted). In some streaming systems, the video bitstreams 204, 209 can be encoded according to certain video coding/compression standards.

Figure 3:
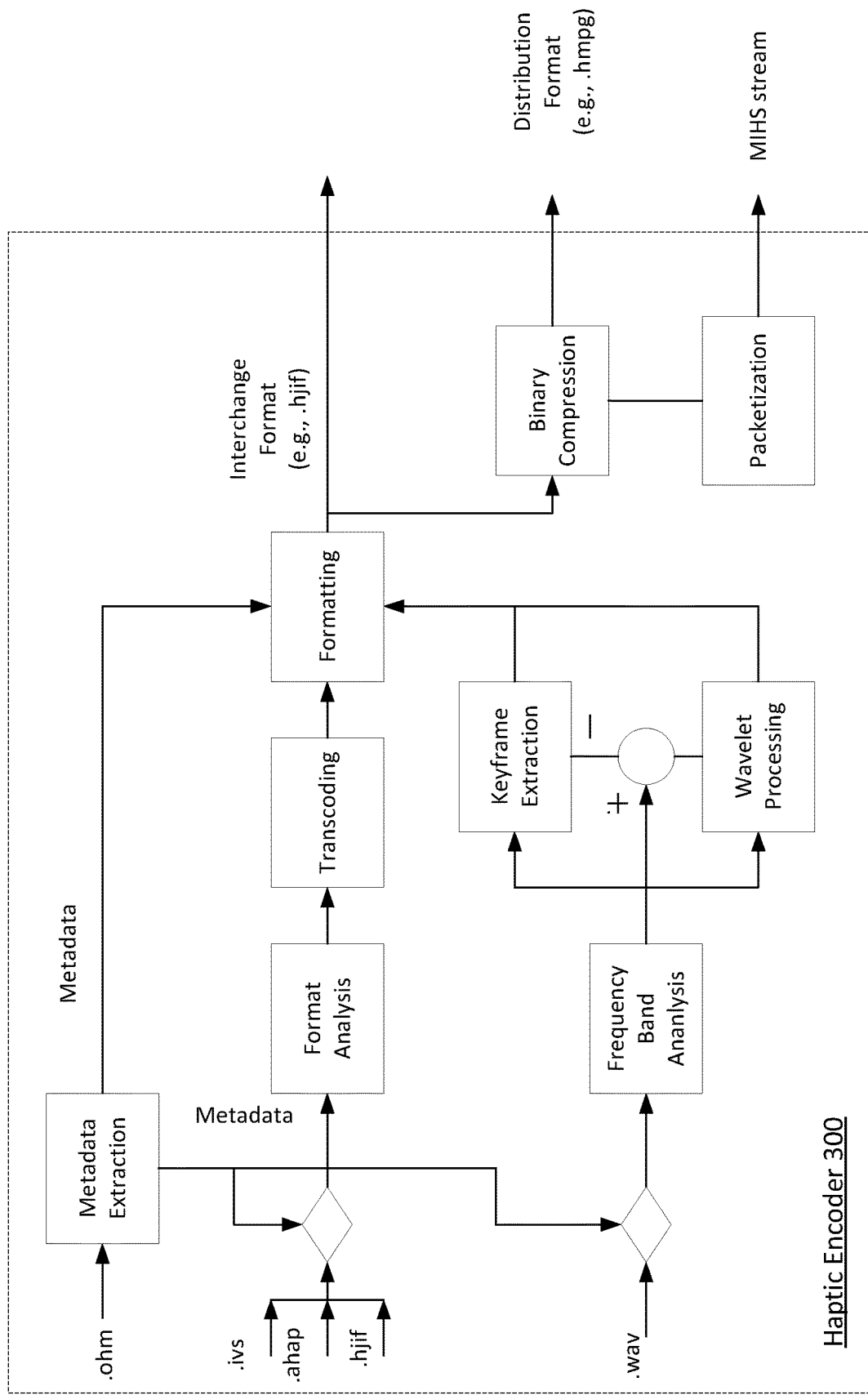
FIG. 3 is a schematic illustration of a simplified block diagram of a haptic encoder, in accordance with embodiments of the present disclosure.
Figure 4:
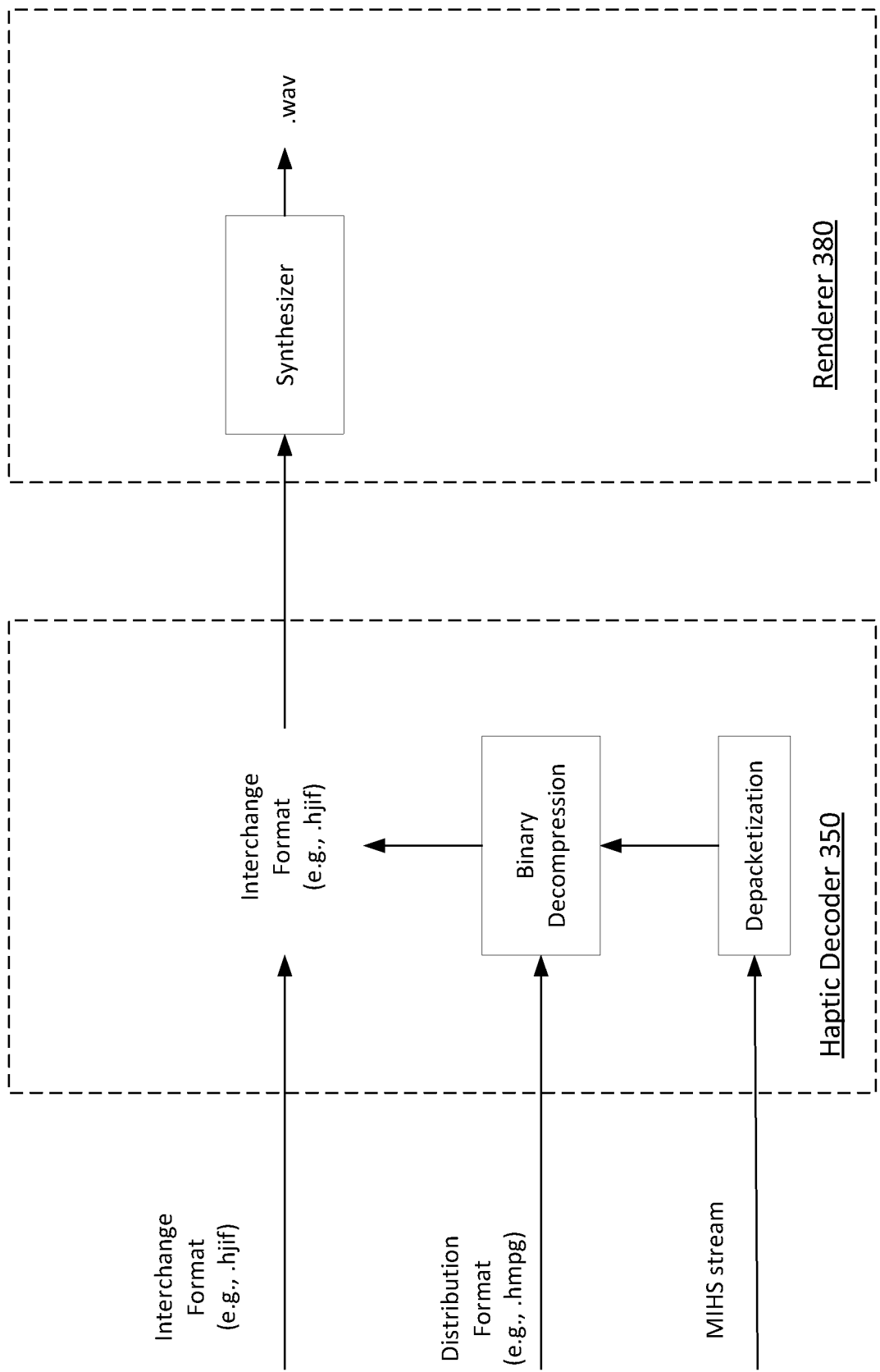
FIG. 4 is a schematic illustration of a simplified block diagram of a haptic decoder and haptic renderer, in accordance with embodiments of the present disclosure.

With reference to FIGS. 3-4, an embodiment of the present disclosure for implementing haptic encoder 300 and haptic decoder 350 are described.

As shown in FIG. 3, the haptic encoder 300 may receive both descriptive and waveform haptic data. Thus, the haptic encoder 300 may be able to process three types of input files: .ohm metadata files (Object Haptic Metadata—Text file format for haptics metadata), descriptive haptics files (.ivs, .ahap, and .hjif) or waveform PCM files (.wav). An example of descriptive data may include .ahap (Apple Haptic and Audio Pattern—JSON-like file format that specifies a haptic pattern) from Apple (representing the expected haptic output by a set of modulated continuous signals and a set of modulated transients parametrized), .ivs from Immersion (representing the expected haptic output by a set of basis effects parametrized by a set of parameters), or .hjif (Haptics JSON Interchange Format) the proposed MPEG format. An example of the waveform pulse-code modulation (PCM) signals may include .ohm input files that include metadata information.

According to an embodiment, the haptic encoder 300 may process the two types of input files differently. For descriptive content, the haptic encoder 300 may analyze the input semantically to transcode (if necessary) the data into the proposed coded representation.

According to an embodiment, the .ohm metadata input file may include a description of the haptic system and setup. In particular, it may include the name of each associated haptic file (either descriptive or PCM) along with a description of the signals. It also provides a mapping between each channel of the signals and the targeted body parts on the user's body. For the .ohm metadata input file, the haptic encoder performs metadata extraction by retrieving the associated haptic files from the URI and encodes it based on its type and by extracting the metadata from the .ohm file and maps it to metadata information of the data model.

According to an embodiment, descriptive haptics files (e.g., .ivs, .ahap, and .hjif) may be encoded through a simple process. The haptic encoder 300 first identifies specifically the input format. If the input format is a .hjif file, then no transcoding is necessary, the file can be further edited, compressed into the binary format and eventually packetized into an MIHS stream. If .ahap or .ivs input files are used, a transcoding is necessary. The haptic encoder 300 first analyses the input file information semantically and transcodes it to be formatted into a selected data model. After transcoding, the data can be exported as the .hjif file, a .hmpg binary file or an MIHS stream.

According to an embodiment, the haptic encoder 300 may perform signal analysis to interpret the signal structure of the .wav files and convert it into the proposed encoded representation. For waveform PCM content, the signal analysis process may be split into two sub-processes by the haptic encoder 300. After performing a frequency band decomposition on the signal, at a first sub-process, low frequencies may be encoded using a keyframe extraction process. The low frequency band(s) may then be reconstructed and the error between this signal and the original low frequency signal may be computed. This residual signal may then be added to the original high frequency band(s), before encoding using Wavelet Transforms, the encoding using Wavelet Transforms being the second sub-process. According to an embodiment, when several low frequency bands are used, the residual errors from all the low frequency bands are added to the high frequency band before encoding. In embodiment when several high frequency bands are used, the residual errors from the low frequency band(s) are added to the first high frequency band before encoding.

According to an embodiment, keyframe extraction includes taking the lower frequency band from the frequency band decomposition and analysing its content in the time domain. According to an embodiment, wavelet processing may include taking the high frequency band from the frequency band decomposition and the low frequency residual, and splitting it into blocks of equal size. These signal blocks of equal size are then analysed in a psychohaptic model. The lossy compression may be applied by wavelet transforming the block and quantizing it, aided by the psychohaptic model. In the end, each block is then saved into a separate effect in a single band, which is done in the formatting. The binary compression may apply lossless compression using the appropriate coding techniques, e.g., the Set partitioning in hierarchical trees (SPIHT) algorithm and Arithmetic Coding (AC).

As shown in FIG. 3, the haptic encoder 300 may be configured to encode descriptive and quantized haptic data and may output three types of formats—an interchange format (.hjif), a binary compressed format (.hmpg), and a streaming format (e.g., MPEG immersive haptic stream (MIHS)). The .hjif format is a human-readable format based on JSON and can easily be parsed and manually edited which makes it an ideal interchange format, especially when designing/creating content. For distribution purposes, the .hjif data can be compressed into a more memory efficient binary .hmpg bitstream. This compression may be lossy, with different parameters impacting the encoding depth of amplitude and frequencies composing the bitstream. For streaming purposes, the data can be compressed and packetized into a MPEG-I haptic stream (MIHS). The above-mentioned three formats have complementary purposes and a lossy one-to-one conversion may be operated between them.

As shown in FIG. 4, the haptic decoder 350 may take as input either a .hmpg compressed binary file format or an MIHS bitstream. the haptic decoder 350 may output a .hjif interchange format that can be used directly for rendering. The two input formats may go through a binary decompression to extract both the metadata and the data itself from the file and map it to the selected data structure. Then, the data can be exported in the .hjif format to the haptic renderer 380.

As shown in FIG. 4, the renderer 380 comprises a synthesizer. The synthesizer may render haptic data from a .hjif input file into a PCM output file. The rendering and/or synthesizing is informative. According to an embodiment, the synthesizer parses the input files and performs the high-level synthesis distribution between vectorial, wavelets, etc. The synthesis process then goes down to the Band component of the codec in which a synthesis process is called. Then all the bands of a given channel are mixed by a simple addition operator to recreate the desired haptic signal.

According to embodiments, the haptic experience (also referred to as the 'global haptic experience') defines the root of the hierarchical data model. It provides information on the date of the file and the version of the format, it describes the haptic experience, it lists the different avatars (i.e., body representation) used throughout the experience and it defines all the haptic perceptions.

According to embodiments, haptic signals may be encoded on multiple channels. In some embodiments, a haptic channel may define a signal to be rendered at a specific body location with a dedicated actuator/device. Metadata stored at the channel level may include information such as the gain associated to the channel, the mixing weight, the desired body location of the haptic feedback and optionally the reference device and/or a direction. Additional information such as the desired sampling frequency or sample count may also be provided. Finally, the haptic data of a channel is contained in a set of haptic bands defined by their frequency range. A haptic band describes the haptic signal of a channel in a given frequency range. Bands are defined by a type and a sequential list of haptic effects each containing a set of keyframes. For every type of haptic band, haptic effects may be defined with at least a position (temporal or spatial) and a type. Depending on the type of band and the type of effect, additional properties may be specified, including the phase, the base signal, a composition and a number of consecutive haptic keyframes describing the effect.

According to an embodiment, the haptic data hierarchy is defined in the present disclosure.

Haptic Channels
  Haptic Bands
    Haptic Effects

According to an embodiment, a self-contained stream format to transport MPEG-I haptic data may use a packetized approach and may include two levels of packetization: MPEG-I haptic stream (MIHS) unit which covers a duration of time and includes zero or more MIHS packets and MIHS packet which includes metadata or haptic effect data. In embodiments, the MIHS unit may be referred to as a network abstraction layer unit associated with the haptic data. In embodiments, the MIHS unit may be referred to as a MIHS sample associated with the haptic data.

A random access point in a haptic track is a point in the presentation in which the renderer resets its output and starts rendering the effect starting at that point and after. The random access point in MIHS is defined by the MIHS Unit sync type. An MIHS unit may be a sync or non-sync unit. A sync unit may reset the previous effects and therefore provides an independent haptic experience from the previous MIHS units. A non-sync unit is the continuation of previous MIHS units and cannot be independently decoded and rendered without decoding the previous MIHS unit(s).

According to an embodiment, if an MIHS unit is a sync unit, then its effects and the effects of the units coming after this unit would not have dependencies to the previous MIHS units, i.e. the renderer's output is reset at the start of this MIHS unit. Since MIHS unit timing is monotonically increasing, that means that this point in the presentation is a random access point.

However, as stated above, the HJIF file format defined in the haptic committee draft does not include the signaling of random access points. The HJIF file format does not include sequencing in time in JSON, and thus there are no random access points in the HJIF file.

Therefore, embodiments of the present disclosure are related to introducing sync points, reset points, or random access points in the HJIF file format. A sync point, reset point, or random access point resets the previous effects and therefore provides an independent haptic experience from any previous effects. An advantage of adding random access pints to the HIJF file format is improved efficiency and accuracy. Content is usually created in JSON and transmitted in MIHS format which needs ordering or knowledge of sync points. Often, transcoding content creates errors and may not generate the exact file. Therefore, coding the knowledge of sync or random access points in the HJIF file improves the accuracy and efficiency of the transcoding process.

According to an embodiment, a top-level list of reset positions may be provided as a part of the MPEG_haptics object (also referred to as MPEG haptics object(s)).

As shown in detail below, an array of time stamps may be provided, each defining a sync point. The anchor for the sync point may be the start of the presentation and the timescale property may provide the scale for the time stamps. The array provides global sync points for the entire presentation, i.e., any effect at or after a sync point is independent of the effects prior to the sync point. Therefore, the decoder and rendered are reset at that point and the output of the renderer shall be reset at any sync point for all perceptions. It may be understood that this is a global reset of the decoder and renderer for all previously rendered effects.

TABLE 1

Description of the MPEG_haptics object

| Property | Type | Default | Description | Required |
|---|---|---|---|---|
| version | string | N/A | Provides the version of the ISO/IEC 23090-31 specification. | Yes |
| date | string | N/A | Indicates the creation date of this haptic experience. | Yes |
| description | string | N/A | The user-defined description of this haptic experience. | Yes |
| avatars | array <MPEG_haptics.avatar> | N/A | Provides the List of MPEG_haptics.avatar | Yes |
| perceptions | array<MPEG_haptics.perception> | N/A | Provides the List of MPEG_haptics.perception | |
| syncs | MPEG_haptics.sync | N/A | Provides the List of MPEG_haptics.sync points | |

TABLE 2

Description of the MPEH_haptics.sync object

| Property | Type | Default | Description | Required |
|---|---|---|---|---|
| timescale | integer | 1 | Number of ticks per second | |
| timestamp | Array of integers | 0 | Each member indicates the time of a sync point in ticks, i.e., timestamp/timescale is the timestamp in seconds. The value must be greater or equal to 0. | Yes |

According to a same or another embodiment, a new property for MPEG_haptics.effect may be created. As shown in more detail below, the sync property, if it is set to 1 (or another predetermined value, e.g., 0) resets the decoder and the renderer before rendering this effect. It may be understood that the resetting is localized for the effects that are in the same element this effect belongs to.

TABLE 3

Description of the MPEH_haptics.effect object

| Property | Type | Default | Description | Required |
|---|---|---|---|---|
| id | integer | N/A | Unique identifier of an effect. This attribute is only required for library effects and "Reference" effects. For "Reference" effects, it corresponds to the id of the library effect being referenced. The value must be greater or equal to 0. | No |
| sync | integer | 0 | Indicates whether this effect resets the renderer's output prior to being rendered. The value 1 resets the decoder and renderer and the output of the renderer before rendering this effect. The scope of this resetting is for all effects inside the parent of this effect. The value 0 does not impact the renderer's output. Other values are reserved. | No |
| effect_type | enum<string> | Basis | Indicates the type of haptic effect. Effect-type value equals one of: "Basis", "Composite" and "Reference." | Yes |
| position | integer | 0 | Indicates the temporal or spatial position of the effect. The value must be greater or equal to 0. | Yes |

TABLE 3-continued

Description of the MPEH_haptics.effect object

| Property | Type | Default | Description | Required |
| --- | --- | --- | --- | --- |
| phase | number | 0 | Phase of the effect. The value should be in the range [0, 6.28318]. | Yes |
| base_signal | enum<string> | Sine | Indicates the type of the waveform signal. This property is required for Vectorial Wave bands. Possible values are: "Sine" "Square" "Triangle" "SawToothUp" "SawToothDown" | No |
| composition | array <MPEG_haptics.effect> | N/A | This attribute can only be used with Composite effects. It contains a list of effects. This type of effect does not directly contain keyframes. | No |
| keyframes | array <MPEG_haptics.keyframe> | N/A | List of MPEG_haptics.keyframes. This property is required for Basis effects. If the keyframes array is empty, the effect does not contain haptic data. | No |

According to a same or another embodiment, a new effect type "reset" may be introduced as shown in Table 4 below.

TABLE 4

Description of the MPEH_haptics.effect object

| Property | Type | Default | Description | Required |
| --- | --- | --- | --- | --- |
| id | integer | N/A | Unique identifier of an effect. This attribute is only required for library effects and "Reference" effects. For "Reference" effects, it corresponds to the id of the library effect being referenced. The value must be greater or equal to 0. | No |
| effect_type | enum<string> | Basis | Indicates the type of haptic effect. Effect-type value equals one of: "Basis", "Composite" "Reference", and "Reset." | Yes |
| position | integer | 0 | Indicates the temporal or spatial position of the effect. The value must be greater or equal to 0. | Yes |
| phase | number | 0 | Phase of the effect. The value should be in the range [0, 6.28318]. | Yes (unless effect_type = Reset) |
| base_signal | enum<string> | Sine | Indicates the type of the waveform signal. This property is required for Vectorial Wave bands. Possible values are: "Sine" "Square" "Triangle" "SawToothUp" "SawToothDown" | No |
| composition | array<MPEG_haptics.effect> | N/A | This attribute can only be used with Composite effects. It contains a list of effects. This type of effect does not directly contain keyframes. | No |
| keyframes | array<MPEG_haptics.keyframe> | N/A | List of MPEG_haptics.keyframes. This property is required for Basis effects. If the keyframes array is empty, the effect does not contain haptic data. | No |

Where effect type is a type of Haptic effect and has the following possible values:
  Basis: Effect containing signal data defined through a set of keyframes
  Composite: Effect composed of a set of other effects defined in the composition property. This type of effect does not directly contain keyframes
  Reference: Effect referencing an effect in the library. This type of effect is used at the band level to reference effects defined at the perception level in the effect library with a unique id.
  Reset: Effect resets the previous effects' outputs for this channel. In this case, values for phase, base_signal, composition, and keyframes are ignored. This is an addition according to embodiments of the disclosure.

The effect type "Reset", resets the decoder and renderer at its position. It may be understood that in this case, only the position value of this effect carries useful information and all other information may be ignored. The scope of this resetting is for the effects that are contained in the parent element of this effect.

According to a same or another embodiment, the playback ability of any of the above embodiments may be improved based on the effects of each parent being ordered based on their position values. Therefore, an effect shall appear in the HJIF file before any other effect with a larger position value. Effectively, the effects may be ordered based on their timing and if a reset occurs with any of the above solutions at any time in the presentation timeline, the impact of effects with positions before that point would be reset before rendering any new events. The scope of resetting varies depending on the embodiment.

Therefore, embodiments of the present disclosure relate to methods and processes for signaling the reset points in the Haptics HJIF file format. The file format may include an array of the timestamps that shows the reset points in the timeline, with each reset point, the decoder and renderer are reset from the previously rendered effects and they start from zero rendering the effect that is positioned at that point or after. In embodiments, each sync point provides a global reset of the haptic decoder and renderer where the impact of the previously rendered effect is eliminated. In embodiments, an alternative method for signaling may include defining a new effect type which is used for resetting the decoder and renderer. The other method for signaling may include introducing a new property for effects, which indicates that the effect is a resync effect, meaning it reset the decoder and renderer at its position for the effects that are in the same element of the resync/reset effect, effectively resetting of the decoder and renderer is localized to a set of effect.

Figure 5:
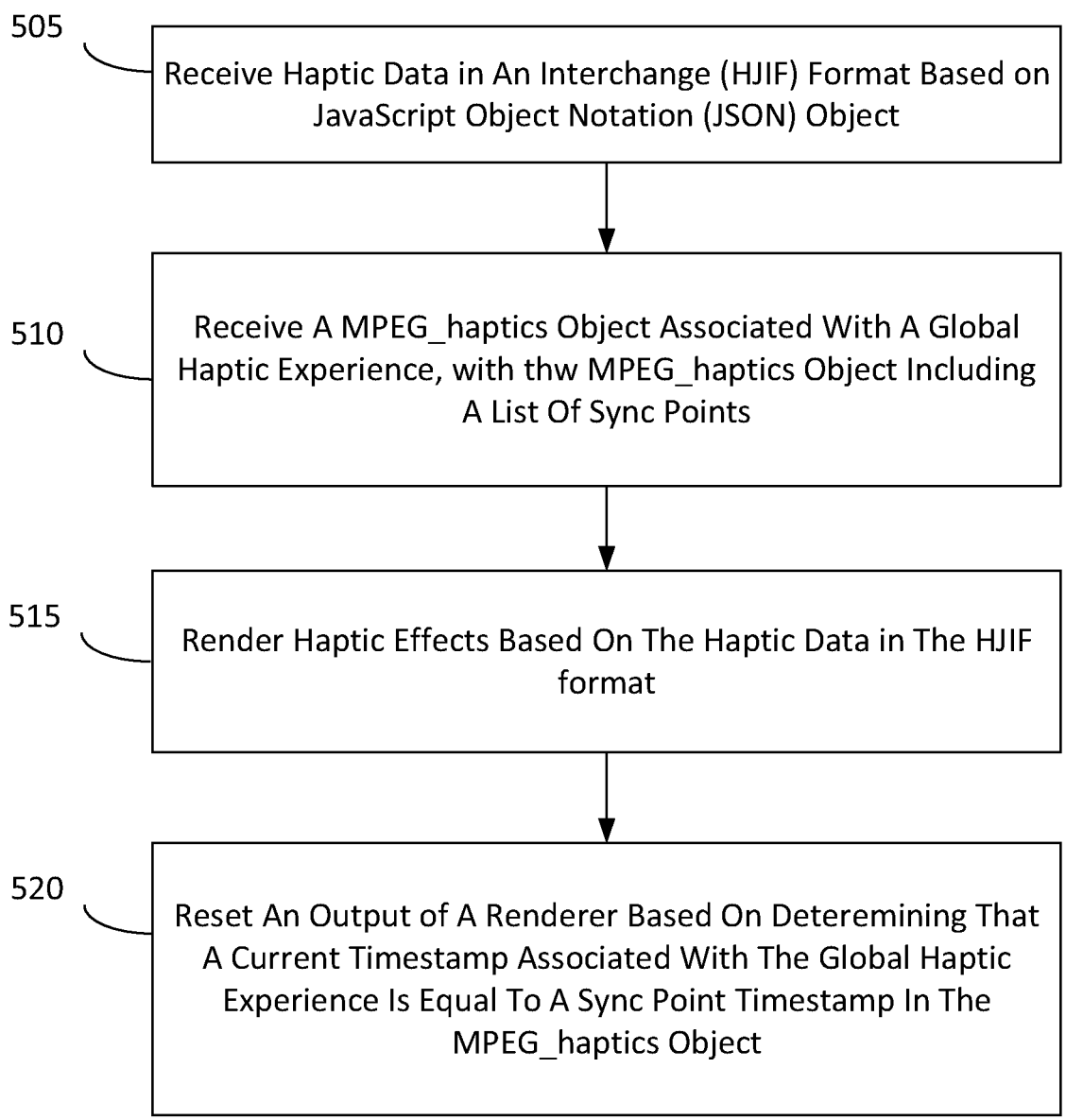
FIG. 5 is an exemplary flow diagram illustrating a process for decoding haptic data in accordance with embodiments of the present disclosure.

FIG. 5 describes a process 500 for decoding haptic data according to an embodiment.

At operation 505, haptic data in an interchange (HJIF) format based on JavaScript Object Notation (JSON) object may be received.

At operation 510, a moving picture experts group haptics (MPEG_haptics) object associated with a global haptic experience may be received. The MPEG_haptics object in the HJIF format may include a list of sync or reset point timestamps. The reset point timestamp may indicate a time at which the output of the rendered is reset.

In embodiment, the MPEG_haptics object may further include a timescale parameter. The timescale parameter may be an integer that indicates a scale for sync or reset point timestamps in the array of sync or reset point timestamps, with the scale being in number of ticks per second.

In an embodiment, MPEG_haptics object may include an array of sync or reset point timestamps, and the array of sync or reset point timestamps may be an array of integers. The number of integers in the array of integers may be greater than or equal to zero.

At operation 515, effects based on the haptic data in the HJIF format may be rendered. The, at operation 520, an output of a renderer may be reset based on determining that a current timestamp associated with the global haptic experience is equal to a reset point timestamp in the MPEG_haptics object.

According to an embodiment, resetting the output of the renderer may indicate that effects subsequent to the resetting are independent of effects prior to the resetting.

A person of skill in the art understands that the techniques described herein may be implemented on both the encoder side and the decoder side. The techniques, described above, can be implemented as computer software using computer-readable instructions and physically stored in one or more computer-readable media. For example, FIG. 6 shows a computer system 600 suitable for implementing certain embodiments of the disclosure.

The computer software can be coded using any suitable machine code or computer language, that may be subject to assembly, compilation, linking, or like mechanisms to create code including instructions that can be executed directly, or through interpretation, micro-code execution, and the like, by computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 6:
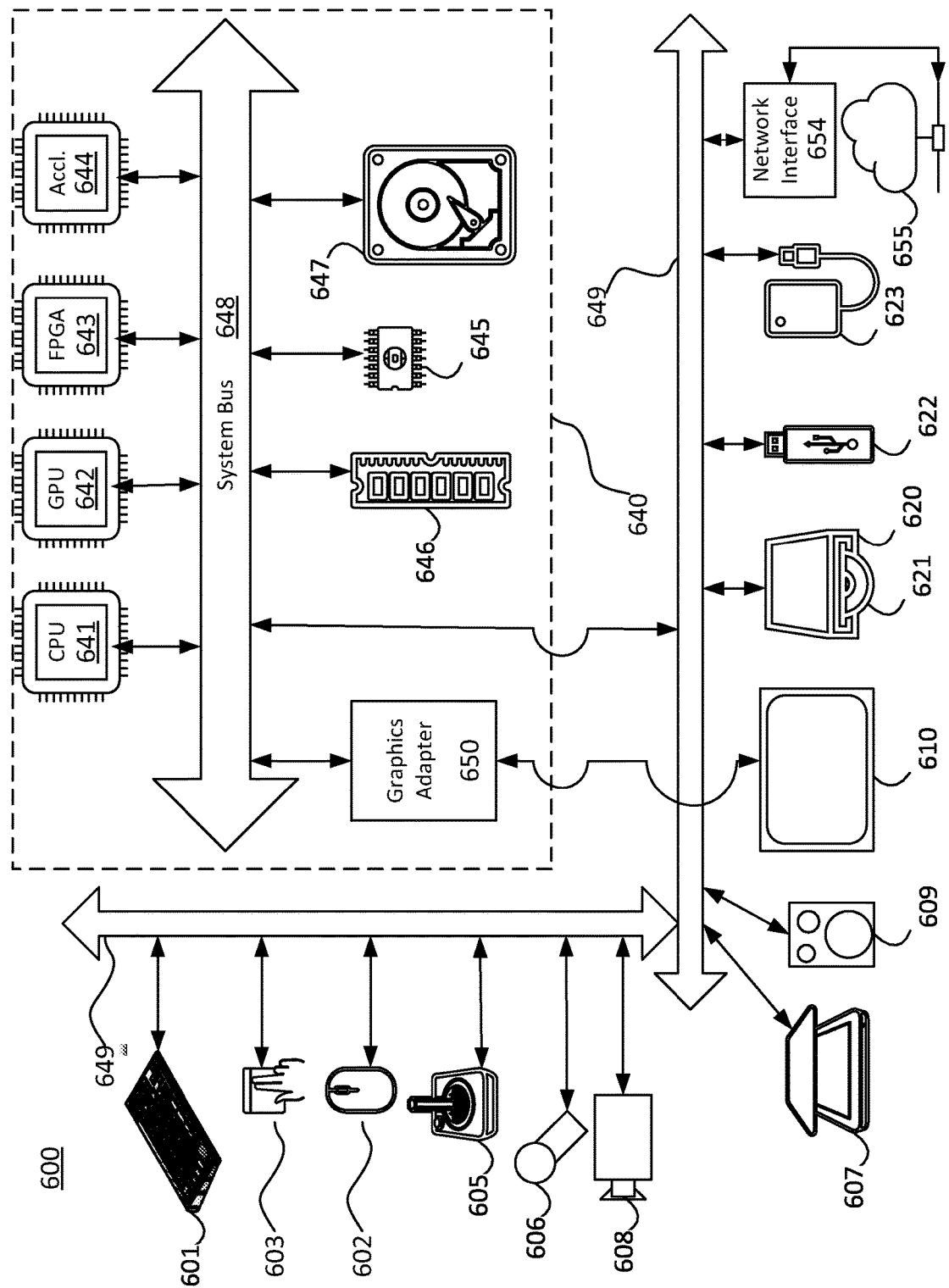
FIG. 6 is a diagram of a computer system suitable for implementing embodiments.

The components shown in FIG. 6 for computer system 600 are examples and are not intended to suggest any limitation as to the scope of use or functionality of the computer software implementing embodiments of the present disclosure. Neither should the configuration of components be interpreted as having any dependency or requirement relating to any one or combination of components illustrated in the non-limiting embodiment of a computer system 600.

Computer system 600 may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard 601, mouse 602, trackpad 603, touch screen 610, data-glove, joystick 605, microphone 606, scanner 607, camera 608.

Computer system 600 may also include certain human interface output devices. Such human interface output devices may be stimulating the senses of one or more human users through, for example, tactile output, sound, light, and smell/taste. Such human interface output devices may include tactile output devices (for example tactile feedback by the touch-screen 610, data glove, or joystick 605, but there can also be tactile feedback devices that do not serve as input devices). For example, such devices may be audio output devices (such as: speakers 609, headphones (not depicted)), visual output devices (such as screens 610 to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system 600 can also include human accessible storage devices and their associated media such as optical media including CD/DVD ROM/RW 620 with CD/DVD or the like media 621, thumb-drive 622, removable hard drive or solid state drive 623, legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system 600 can also include interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses 649 (such as, for example USB ports of the computer system 600; others are commonly integrated into the core of the computer system 600 by attachment to a system bus as described below (for example Ethernet interface into a PC computer system or cellular network interface into a smartphone computer system). Using any of these networks, computer system 600 can communicate with other entities. Such communication can be uni-directional, receive only (for example, broadcast TV), uni-directional send-only (for example CANbus to certain CANbus devices), or bi-directional, for example to other computer systems using local or wide area digital networks. Such communication can include communication to a cloud computing environment 655. Certain protocols and protocol stacks can be used on each of those networks and network interfaces as described above.

Aforementioned human interface devices, human-accessible storage devices, and network interfaces 654 can be attached to a core 640 of the computer system 600.

The core 640 can include one or more Central Processing Units (CPU) 641, Graphics Processing Units (GPU) 642, specialized programmable processing units in the form of Field Programmable Gate Areas (FPGA) 643, hardware accelerators for certain tasks 644, and so forth. These devices, along with Read-only memory (ROM) 645, Random-access memory 646, internal mass storage such as internal non-user accessible hard drives, SSDs, and the like 647, may be connected through a system bus 648. In some computer systems, the system bus 648 can be accessible in the form of one or more physical plugs to enable extensions by additional CPUs, GPU, and the like. The peripheral devices can be attached either directly to the core's system bus 648, or through a peripheral bus 649. Architectures for a peripheral bus include PCI, USB, and the like. A graphics adapter 650 may be included in the core 640.

CPUs 641, GPUs 642, FPGAs 643, and accelerators 644 can execute certain instructions that, in combination, can make up the aforementioned computer code. That computer code can be stored in ROM 645 or RAM 646. Transitional data can be also be stored in RAM 646, whereas permanent data can be stored for example, in the internal mass storage 647. Fast storage and retrieve to any of the memory devices can be enabled through the use of cache memory, that can be closely associated with one or more CPU 641, GPU 642, mass storage 647, ROM 645, RAM 646, and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, a computer system having the architecture of computer system 600, and specifically the core 640 can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core 640 that are of non-transitory nature, such as core-internal mass storage 647 or ROM 645. The software implementing various embodiments of the present disclosure can be stored in such devices and executed by core 640. A computer-readable medium can include one or more memory devices or chips, according to particular needs. The software can cause the core 640 and specifically the processors therein (including CPU, GPU, FPGA, and the like) to execute particular processes or particular parts of particular processes described herein, including defining data structures stored in RAM 646 and modifying such data structures according to the processes defined by the software. In addition or as an alternative, the computer system can provide functionality as a result of logic hardwired or otherwise embodied in a circuit (for example: accelerator 644), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several non-limiting embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method for decoding haptic data, the method being performed by at least one processor, the method comprising:
   receiving haptic data in a Haptics JSON-based Interchange Format (HJIF) based on a JavaScript Object Notation (JSON) object;
   receiving a moving picture experts group (MPEG) haptics object associated with a global haptic experience, the MPEG haptics object in the haptic data in the HJIF comprising a plurality of reset point timestamps;
   rendering effects based on the haptic data in the HJIF; and
   resetting an output of a renderer responsive to determining that a current timestamp associated with the global haptic experience is equal to a reset point timestamp in the MPEG haptics object.

2. The method of claim 1, wherein resetting the output of the renderer indicates that effects subsequent to the resetting are independent of effects prior to the resetting.

3. The method of claim 1, wherein the MPEG haptics object comprises an array of reset point timestamps, and
   wherein the array of reset point timestamps is an array of integers.

4. The method of claim 3, wherein a number of integers in the array of integers is greater than or equal to zero.

5. The method of claim 3, wherein the reset point timestamp indicates a time at which the output of the rendered is reset.

6. The method of claim 5, wherein the MPEG haptics object further comprises a timescale parameter.

7. The method of claim 6, wherein the timescale parameter indicates a scale for reset point timestamps in the array of reset point timestamps, wherein the scale is in number of ticks per second, and
   wherein the timescale parameter is an integer.

8. An apparatus for decoding haptic data, the apparatus comprising:
   at least one memory configured to store program code; and
   at least one processor configured to read the program code and operate as instructed by the program code, the program code including:
      first receiving code configured to cause the at least one processor to receive haptic data in a Haptics JSON-based Interchange Format (HJIF) based on a JavaScript Object Notation (JSON) object;

second receiving code configured to cause the at least one processor to receive a moving picture experts group (MPEG) haptics object associated with a global haptic experience, the MPEG haptics object in the haptic data in the HJIF comprising a plurality of reset point timestamps;

rendering code configured to cause the at least one processor to render effects based on the haptic data in the HJIF; and resetting code configured to cause the at least one processor to reset an output of a renderer responsive to determining that a current timestamp associated with the global haptic experience is equal to a reset point timestamp in the MPEG haptics object.

9. The apparatus of claim 8, wherein resetting the output of the renderer indicates that effects subsequent to the resetting are independent of effects prior to the resetting.

10. The apparatus of claim 8, wherein the MPEG haptics object comprises an array of reset point timestamps, and wherein the array of reset point timestamps is an array of integers.

11. The apparatus of claim 10, wherein a number of integers in the array of integers is greater than or equal to zero.

12. The apparatus of claim 10, wherein the reset point timestamp indicates a time at which the output of the rendered is reset.

13. The apparatus of claim 12, wherein the MPEG haptics object further comprises a timescale parameter.

14. The apparatus of claim 13, wherein the timescale parameter indicates a scale for reset point timestamps in the array of reset point timestamps, wherein the scale is in number of ticks per second, and wherein the timescale parameter is an integer.

15. A non-transitory computer-readable medium storing instructions, the instructions comprising: one or more instructions that, when executed by one or more processors of a device for decoding haptic data, cause the one or more processors to:

receive haptic data in a Haptics JSON-based Interchange Format (HJIF) based on a JavaScript Object Notation (JSON) object;

receive a moving picture experts group (MPEG) haptics (MPEG_haptics) object associated with a global haptic experience, the MPEG_haptics object in the haptic data in the HJIF format comprising a list plurality of sync reset point timestamps;

render effects based on the haptic data in the HJIF; and reset an output of a renderer responsive to determining that a current timestamp associated with the global haptic experience is equal to a reset point timestamp in the MPEG haptics object.

16. The non-transitory computer-readable medium of claim 15, wherein resetting the output of the renderer indicates that effects subsequent to the resetting are independent of effects prior to the resetting.

17. The non-transitory computer-readable medium of claim 15, wherein the MPEG haptics object comprises an array of reset point timestamps, and wherein the array of reset point timestamps is an array of integers.

18. The non-transitory computer-readable medium of claim 17, wherein a number of integers in the array of integers is greater than or equal to zero.

19. The non-transitory computer-readable medium of claim 17, wherein the reset point timestamp indicates a time at which the output of the rendered is reset.

20. The non-transitory computer-readable medium of claim 19, wherein the MPEG haptics object further comprises a timescale parameter.

* * * * *